(12) United States Patent
Huang et al.

(10) Patent No.: US 8,423,923 B2
(45) Date of Patent: Apr. 16, 2013

(54) OPTICAL PROXIMITY CORRECTION METHOD

(75) Inventors: Chia-Wei Huang, Tainan (TW);
Ming-Jui Chen, Tainan (TW);
Ting-Cheng Tseng, Tainan (TW);
Hui-Fang Kuo, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/186,475

(22) Filed: Jul. 20, 2011

(65) Prior Publication Data

US 2013/0024824 A1   Jan. 24, 2013

(51) Int. Cl.
*G06F 17/50* (2006.01)
*G03F 1/00* (2006.01)
*G03F 7/00* (2006.01)

(52) U.S. Cl.
USPC .......... 716/53; 716/50; 716/51; 716/52; 716/54; 716/55; 430/5; 430/312

(58) Field of Classification Search .......... 716/50–55; 430/5, 312
See application file for complete search history.

(56) References Cited

U.S. PATENT DOCUMENTS

| | | | |
|---|---|---|---|
| 6,033,811 A | 3/2000 | Lee | |
| 6,383,940 B1 * | 5/2002 | Yoshimura | 438/708 |
| 6,395,438 B1 | 5/2002 | Bruce | |
| 6,470,489 B1 | 10/2002 | Chang | |
| 6,684,382 B2 | 1/2004 | Liu | |
| 6,753,115 B2 | 6/2004 | Zhang | |
| 6,763,514 B2 | 7/2004 | Zhang | |
| 6,804,388 B2 * | 10/2004 | Vernackt | 382/151 |
| 6,852,453 B2 | 2/2005 | Wu | |
| 6,961,920 B2 | 11/2005 | Zach | |
| 6,986,973 B2 * | 1/2006 | Yao et al. | 430/5 |
| 7,277,165 B2 * | 10/2007 | Wu et al. | 356/237.5 |
| 7,386,829 B2 | 6/2008 | Lee | |
| 7,540,970 B2 * | 6/2009 | Koh et al. | 216/41 |
| 7,582,413 B2 * | 9/2009 | Chen | 430/322 |
| 7,624,369 B2 | 11/2009 | Graur | |
| 7,794,920 B2 | 9/2010 | Choi | |
| 7,804,646 B2 * | 9/2010 | Chen et al. | 359/558 |
| 7,811,746 B2 * | 10/2010 | Finders | 430/313 |
| 7,829,266 B2 * | 11/2010 | Deng et al. | 430/312 |
| 7,913,197 B1 * | 3/2011 | Kruger et al. | 716/53 |
| 8,064,681 B2 * | 11/2011 | Okai et al. | 382/141 |
| 8,084,872 B2 * | 12/2011 | Yang | 257/797 |
| 8,132,130 B2 * | 3/2012 | Chen et al. | 716/54 |
| 2006/0066339 A1 | 3/2006 | Rajski | |
| 2006/0085772 A1 | 4/2006 | Zhang | |
| 2006/0161452 A1 | 7/2006 | Hess | |
| 2007/0105023 A1 | 5/2007 | Zhou | |
| 2007/0166627 A1 | 7/2007 | Sugimoto | |
| 2009/0193385 A1 | 7/2009 | Yang | |

(Continued)

*Primary Examiner* — Helen Rossoshek

(74) *Attorney, Agent, or Firm* — Winston Hsu; Scott Margo

(57) ABSTRACT

An optical proximity correction method is provided. A target pattern is provided, and then the target pattern is decomposed to a first pattern and a second pattern. The first pattern and the second pattern are alternately arranged in a dense region. Then, a compensation pattern is provided and it is determined whether the compensation pattern is added into the first pattern to become a first revised pattern, or into the second pattern to become a second revised pattern. Finally, the first revised pattern is output onto a first mask and the second revised pattern is output onto a second mask.

12 Claims, 4 Drawing Sheets

U.S. PATENT DOCUMENTS

| | | |
|---|---|---|
| 2009/0278569 A1 | 11/2009 | Taoka |
| 2009/0300576 A1 | 12/2009 | Huang |
| 2010/0036644 A1 | 2/2010 | Yang |
| 2010/0070944 A1 | 3/2010 | Wu |
| 2010/0086862 A1 | 4/2010 | Yang |
| 2010/0131914 A1 | 5/2010 | Wu |
| 2010/0175041 A1 | 7/2010 | Krasnoperova |
| 2011/0029939 A1 | 2/2011 | Yang |

* cited by examiner

OPTICAL PROXIMITY CORRECTION METHOD

BACKGROUND OF THE INVENTION

1. Field of the Invention

The present invention relates to an optical proximity correction method, and more particularly, to an optical proximity correction method which uses a compensation pattern and can be applied to a double exposure technique.

2. Description of the Prior Art

In semiconductor manufacturing processes, in order to transfer an integrated circuit layout onto a semiconductor wafer, the integrated circuit layout is first designed and formed as a photo-mask pattern. The photo-mask pattern is then proportionally transferred to a photoresist layer positioned on the semiconductor wafer.

In recent years, with the increasing miniaturization of semiconductor devices, the design rule of line width and space between lines or devices becomes finer. However, the width is subject to optical characteristics. To obtain fine-sized devices in the exposure, the interval between transparent regions in a mask is scaled down with device size. When the light passes through the mask, diffraction occurs and reduces resolution. Moreover, when light passes through the transparent regions of a mask having different interval sizes, the light through the regions having small interval sizes is influenced by the transparent regions having large interval sizes and results in deformation of the transfer pattern.

A double-exposure technique has been developed in recent years. The double-exposure technique involves decomposing a target pattern into two separated patterns, which are then transferred to a photoresist layer respectively by two exposure processes. Since the pitch of the decomposed pattern is larger, the pattern can be formed by current exposure systems. However, there are still some problems needed to be overcome in the double-exposure technique.

SUMMARY OF THE INVENTION

The present invention therefore provides an optical proximity correction method which can be used in a double-exposure technique.

According to one embodiment, an optical proximity correction method is provided. A target pattern is provided, and then the target pattern is decomposed to a first pattern and a second pattern. The first pattern and the second pattern are alternately arranged in a dense region. Then, a compensation pattern is provided and it is determined whether the compensation pattern is added into the first pattern to become a first revised pattern, or into the second pattern to become a second revised pattern. Finally, the first revised pattern is output onto a first mask and the second revised pattern is output onto a second mask.

According to another embodiment, a circuit pattern is provided. The circuit pattern includes a plurality of stripe patterns parallel to each other. The stripe patterns are disposed in a dense region and comprise a first edge stripe pattern adjacent to the edge of the dense region and a second edge stripe pattern adjacent to the first edge stripe pattern. The first edge stripe pattern comprises a compensation pattern which extrudes from the first edge stripe pattern in a side opposite to the second edge stripe pattern.

The present invention provides an optical proximity correction method and a circuit pattern formed by the method. The bridge phenomenon of the patterns in the dense region can be prevented by using the compensation pattern, so the yields of the product can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
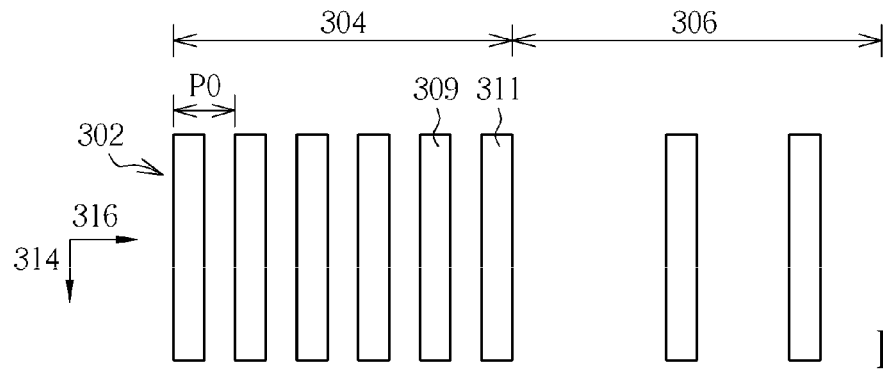
FIG. 1 to FIG. 4 illustrate schematic diagrams of the optical proximity correction method in the present invention.

Please refer to FIG. 1 to FIG. 4, illustrating schematic diagrams of the optical proximity correction method in the present invention. As shown in FIG. 1, a target pattern 302 is provided. For example, the target pattern 302 is input into a computer system (not shown). The target patterns 302 refers to the final pattern which will be formed on the semiconductor photoresist layer (not shown) in the followed up steps and reflects the layout of the electrical circuit. According to the degree of density, the target pattern 302 can be divided into a dense region 304 which has a larger pattern density per unit area and an isolated region 306 which has a smaller pattern density per unit area. In the dense region 304, the target pattern 302 usually comprises stripe patterns or rectangular patterns with smaller pitch. In the isolated region 306, the pitch of the target pattern 302 is larger. In order to have higher integrity of the device, the pitch P0 of the target pattern 302 in the dense region 304 needs to be minimized. However, current exposure system is not able to form the target pattern 302 with the fine pitch P0 in the dense region 304.

Figure 2:
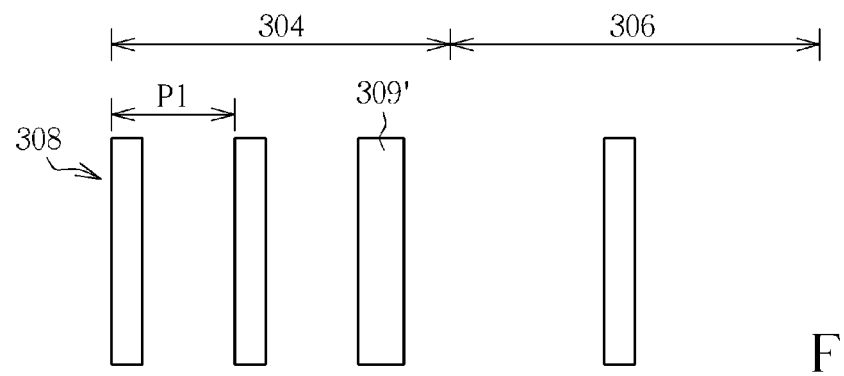
Figure 3:
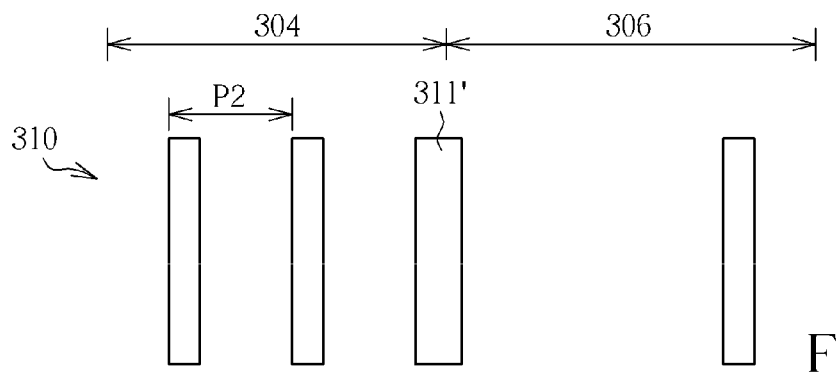

Thus, a double-exposure technique is proposed to solve the above problem. The double-exposure is used to decompose the target pattern 302 into a first pattern and a second pattern. Please refer to FIG. 2 and FIG. 3, illustrating schematic diagrams of the first pattern and the second pattern in the present invention. As shown in FIG. 2 and FIG. 3, the target pattern 302 is decomposed into the first pattern 308 in FIG. 2 and the second pattern 310 in FIG. 3 by the computer system. In the dense region 304, the first pattern 308 and the second pattern 310 are parallel to each other along a first direction 314 and are arranged alternatively. The pitch P1 of the first patterns 308 and the pitch P2 of the second patterns 310 are greater than the critical dimension (CD) of the exposure system. Consequently, a double-exposure technique can be performed by using a first mask (not shown) having the first pattern 308 and a second mask (not shown) having the second pattern 310 separately so as to form the target pattern 302.

However, due to the optical proximity effect (OPE), when light passes through the transparent regions of a mask having different interval sizes, the light through the regions having small pitches (the dense region 304) is influenced by the transparent regions having large pitches (the isolated region 306) and results in deformation of the transfer pattern. In one embodiment of the present invention, a first edge pattern 309' is defined in the first patterns 308 in the dense region 304 where the first edge pattern 309' is closest to the isolated region 306. The width of the first edge pattern 309' is slightly enlarged with respect to that of the first edge pattern 309 in the target pattern 302 in FIG. 1. As shown in FIG. 3, a second edge pattern 311' is defined in the second patterns 310 in the dense region 304 and the second edge pattern 311' is closest to the isolated region 306. The width of the second edge pattern 311' is slightly enlarged with respect to that of the first edge pattern 309 in the target pattern 302 in FIG. 1. By doing this, after the double-exposure process, the first edge pattern 309 and the second edge pattern 311 can be compensated and the target pattern 302 can be formed precisely.

Figure 4:
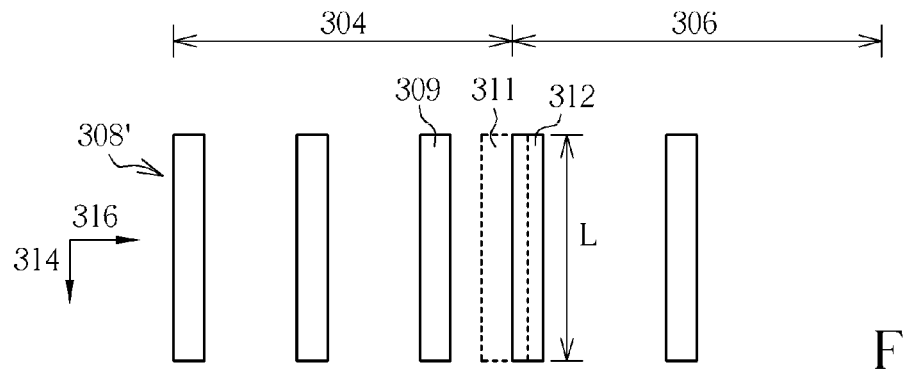

However, in the abovementioned embodiment, a bridge phenomenon may occur because the widened first edge pattern 309' and the widened second edge pattern 311' would bridge to each other on the photoresist layer after the exposure process. In another embodiment, a compensation pattern is provided in the first pattern 308 to make it become a first revised pattern 308' to avoid the bridge phenomenon. Please refer to FIG. 4, illustrating a schematic diagram of the revised first pattern in the present invention. As shown in FIG. 4, in order to avoid the aforementioned bridge phenomenon due to the optical proximity effect near the boundary of the dense region 304 and the isolated region 306, a compensation pattern 312 is provided at the side of the first edge pattern 309 near the isolated region 306. The first edge pattern 309 will not be influenced by the optical proximity effect so there is no need to increase the width of the first edge pattern 309 in comparison with the previous embodiment. Accordingly, the bridge phenomenon caused by widened first edge pattern 309 and widened second edge pattern 311 in the previous embodiment can be avoided. Next, the second pattern 310 in FIG. 3 is output to a second mask, and the first revised pattern 308' is output to a first mask. A double exposure technique is performed by using the first mask and the second mask to form the target pattern 302 to form the target pattern 302 precisely. In one preferred embodiment of the present invention, the position of the compensation pattern 312 partially overlaps the position of the second edge pattern 311 (shown in dotted line in FIG. 4). Preferably, the compensation pattern 312 is substantially parallel to the first edge pattern 309 and the projection of the first edge pattern 309 from the second direction 316 completely overlaps the compensation pattern 312. That is, the length L of the compensation pattern 312 is equally to that of the first edge pattern 309. The first direction 314 is substantially perpendicular to the second direction 316.

Figure 5:
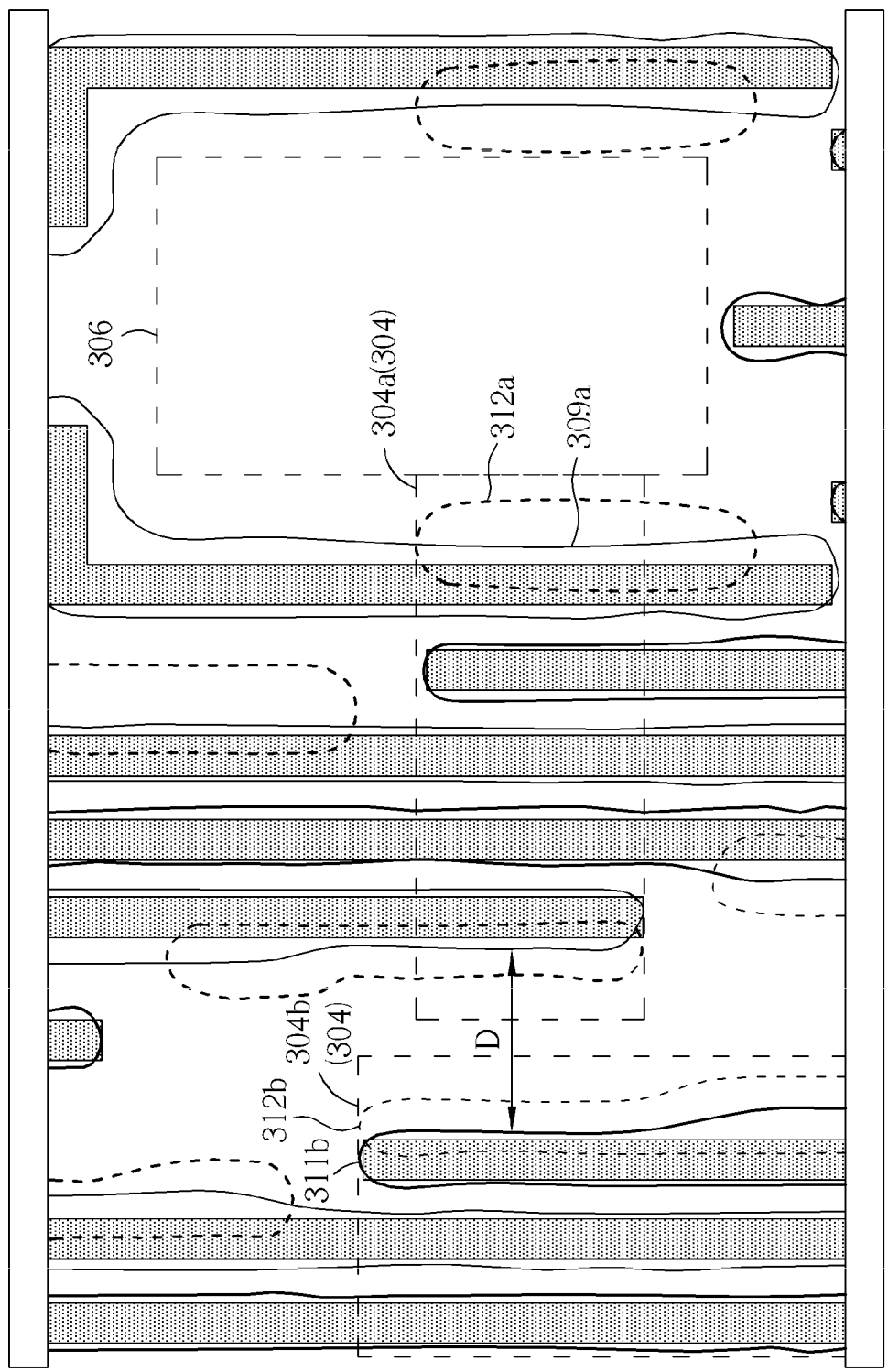
FIG. 5 and FIG. 6 illustrate schematic diagrams of the optical proximity correction method applied to a logic circuit.

Please refer to FIG. 5, illustrating a schematic diagram of the optical proximity correction method applied to a logic circuit. The target pattern 302 in is shown in a bar pattern, the first pattern 308 is shown in thick lines, the second pattern 310 is shown in thin lines, and the compensation pattern 312, depending on being added in the first pattern 308 or in the second pattern 310, is shown in broken thick lines or broken thin lines. It is understood that the first pattern 308 and the compensation pattern 312 together form the first revised pattern 308', and the second pattern 310 and the compensation pattern 312 together form the second revised pattern 310'. In the logic circuit as shown in FIG. 5, the target pattern 302 can be decomposed into a plurality of dense regions 304 and a plurality of isolated regions 306. By using the methods provided in the present invention, at least one first edge pattern 309 or one second edge pattern 311 can be defined near the boundary between the dense regions 304 and the isolated regions 306. At least a compensation pattern 312 can therefore be formed corresponding to the first edge pattern 309 or the second edge patterns 311. For example, in the dense area 304a, a first edge pattern 309a can be found at the right side of the dense region 304a. A compensation pattern 312a is therefore added in the second pattern 310, wherein the compensation pattern 312a partially overlaps the first edge pattern 309a. In the dense area 304b, a second edge pattern 311b can be found at the right side of the dense region 304b. A compensation pattern 312b is therefore added in the first pattern 308, wherein the compensation pattern 312b partially overlaps the second edge pattern 311b.

From the above description, the salient features of the compensation pattern 312 are described as following. First, the compensation pattern 312 is disposed at the boundary between the dense region 304 and the isolated region 306. The dense region 304 and the isolated region 306 may be distinguished by the density of the pattern disposed therein. When the distance between a pattern and its adjacent pattern is greater than twice the minimum pitch P0 (for example, the distance D in FIG. 5), the pattern is defined as being located near the boundary of the dense region 304 and the isolated region 306.

Second, the compensation pattern 312 can be added into the first pattern 308 or the second pattern 310, depending on the whether the first edge pattern 309 or the second edge pattern 311 is located near the boundary of the dense region 304 and the isolated region 306. If it is the first edge pattern 309 of the first pattern 308, then the compensation pattern 312 is added into the second pattern 310. Conversely, if it is the second edge pattern 311 of the second pattern 310, then the compensation pattern 312 is added into the first pattern 308.

Third, the compensation pattern 312 partially overlaps the first edge pattern 309 or the second edge pattern 311. After the double-exposure process and the etching process, the compensation pattern 312 will be transferred on the semiconductor layer and becomes a part of the semiconductor circuit layout.

Figure 6:
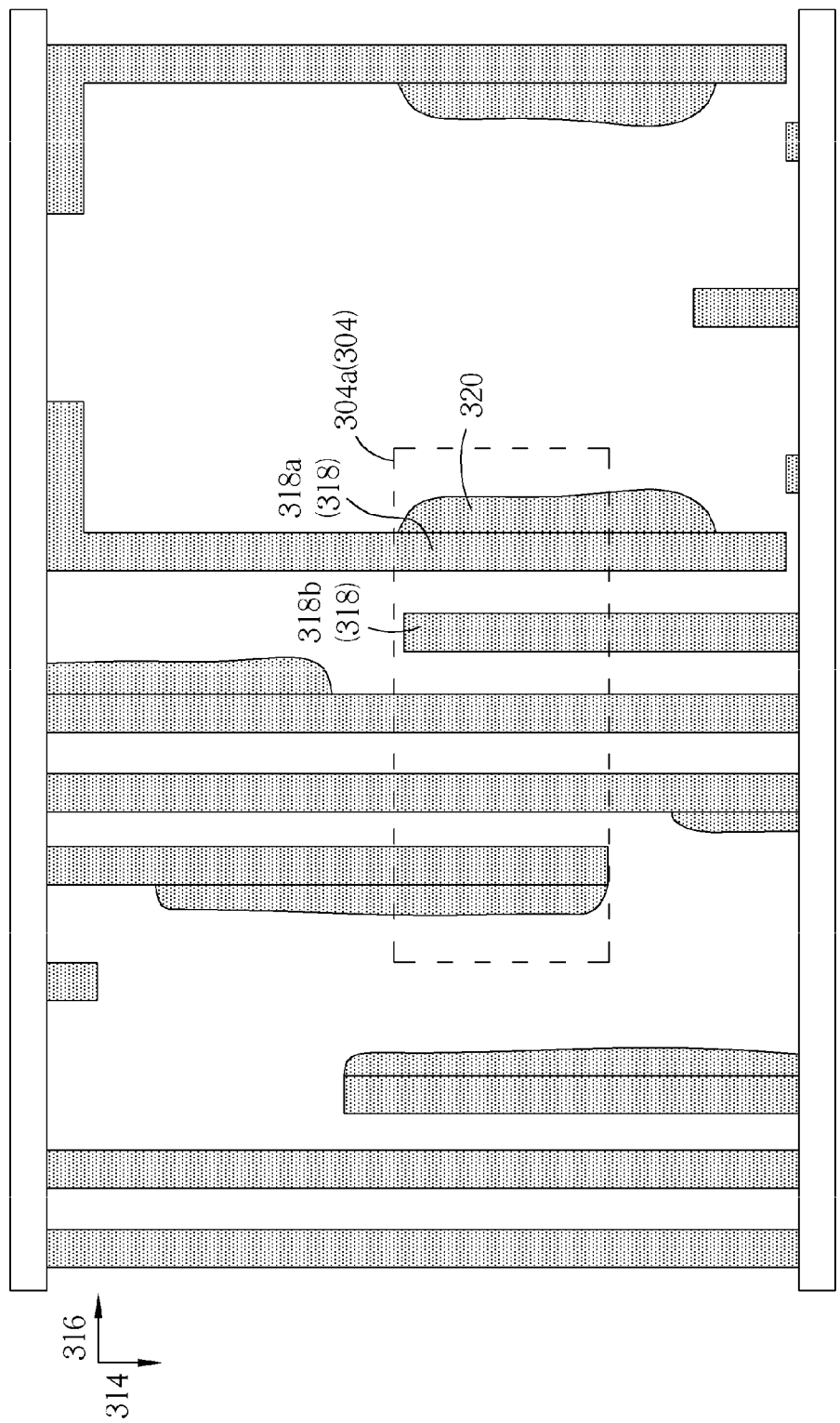

Please refer to FIG. 6, illustrating a schematic diagram of the circuit layout formed by the optical proximity correction method in the present invention. The present invention can be applied to multiple exposure process such as two-photo-one-etching process (2P1E) or two-photo-two-etching process (2P2E). For example, by using the first mask with the first revised pattern 308' to perform a photo-etching process, and then using the second mask with the second revised pattern 310' to perform another photo-etching process, a circuit layout can be formed as shown in FIG. 6. As shown in FIG. 6, a first direction 314 and a second direction 316 which are perpendicular to each other are defined on the circuit layout. In the dense region 304a, the circuit pattern includes a plurality of stripe patterns 318 parallel to each other along the first direction 314. The stripe patterns 318 include a first edge stripe pattern 318 adjacent to the edge of the dense region 304a and a second edge stripe pattern 318b adjacent to the first edge stripe pattern 318a. The first edge stripe pattern 318a includes a compensation pattern 320 which extrudes from the first edge stripe pattern 318a in a side opposite to the second edge stripe pattern 318b. It is understood that the compensation pattern 320 is formed corresponding to the compensation pattern 312 on the mask after the photo-etching process.

Figure 7:
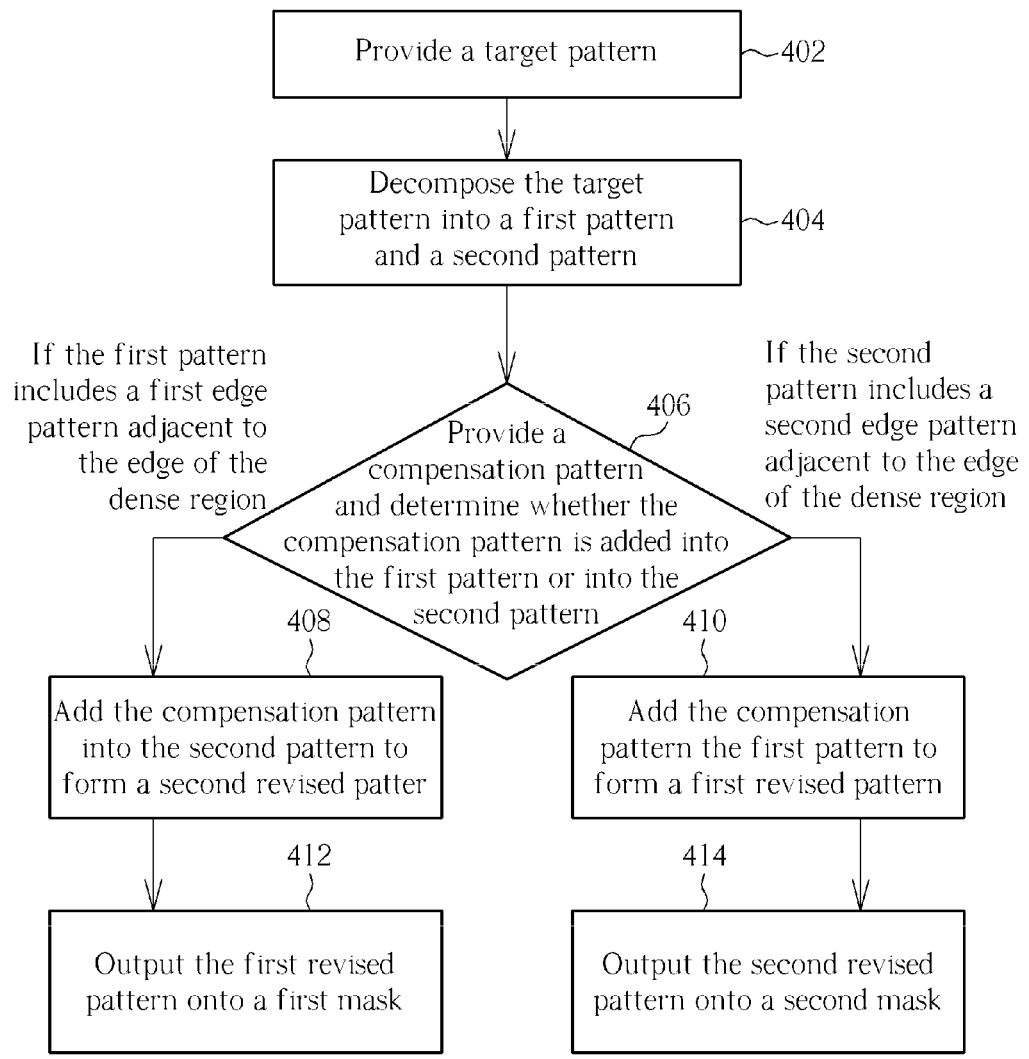
FIG. 7 illustrates a flow chart of the optical proximity correction method in the present invention

Please refer to FIG. 7, illustrating a flow chart of the optical proximity correction method in the present invention. First, a target pattern is provided (step 402) and then the target pattern is decomposed to a first pattern and a second pattern (step 404). The first pattern and the second pattern are alternately arranged in a dense region. Then, a compensate pattern is provided and it is further determined whether the compensation pattern is added into the first pattern or into the second pattern (step 408). If the first pattern includes a first edge pattern adjacent to the edge of the dense region, then the compensation pattern is added into the second pattern to form a second revised pattern (step 408). If the second pattern includes a second edge pattern adjacent to the edge of the dense region, then the compensation pattern is added into the first pattern to form a first revised pattern (step 410). Finally, the first revised pattern is output onto a first mask (step 412) and the second revised pattern is output onto a second mask (step 414).

In summary, the present invention provides an optical proximity correction method and a circuit pattern formed by the method. The bridge phenomenon of the patterns in the dense region can be prevented by using the compensation pattern, so the yields of the product can be improved.

Those skilled in the art will readily observe that numerous modifications and alterations of the device and method may be made while retaining the teachings of the invention.

What is claimed is:

1. An optical proximity correction method, comprising:
providing a target pattern;
decomposing the target pattern into a first pattern and a second pattern, wherein the first pattern and the second pattern are alternately arranged and parallel to each other along a first direction in a dense region, wherein the first pattern includes a first edge pattern closest to the edge of the dense region and the second pattern includes a second edge pattern closest to the edge of the dense region;
performing a first modification process thereby making the first pattern become a first revised pattern, wherein the first modification process comprises providing a first compensation pattern located adjacent to the first edge pattern, wherein a projection of the first compensation pattern along a second direction completely overlaps the first edge pattern to avoid the first edge pattern from being influenced by an optical proximity effect;
performing a second modification process thereby making the second pattern become a second revised pattern;
outputting the first revised pattern onto a first mask; and
outputting the second revised pattern onto a second mask.

2. The optical proximity correction method according to claim 1, wherein the first compensation pattern partially overlaps the second edge pattern.

3. The optical proximity correction method according to claim 1, wherein the first compensation pattern is disposed at the side of the first edge pattern near the edge of the dense region.

4. The optical proximity correction method according to claim 1, wherein the first direction is substantially perpendicular to the second direction.

5. The optical proximity correction method according to claim 1, wherein the second modification process comprises providing a second compensation pattern located adjacent to the second edge pattern, wherein a projection of the second compensation pattern along the second direction completes overlaps the first edge pattern to avoid the second edge pattern from being influenced by the optical proximity effect.

6. The optical proximity correction method according to claim 5, wherein the second compensation pattern partially overlaps the first edge pattern.

7. The optical proximity correction method according to claim 5, wherein the second compensation pattern is disposed at the side of the second edge pattern near the edge of the dense region.

8. The optical proximity correction method according to claim 1, wherein a distance between the target pattern in the dense region and the target pattern not in the dense region is greater than twice the critical dimension of an exposure system.

9. The optical proximity correction method according to claim 1, wherein the pitch of the first pattern in the dense region is substantially greater than the critical dimension of an exposure system.

10. The optical proximity correction method according to claim 1, wherein the first pattern in the dense region comprises a stripe pattern.

11. The optical proximity correction method according to claim 1, wherein the pitch of the second pattern in the dense region is substantially greater than the critical dimension of an exposure system.

12. The optical proximity correction method according to claim 1, wherein the second pattern in the dense region comprises a stripe pattern.

* * * * *